United States Patent [19]

Whistler et al.

[11] 4,370,615

[45] Jan. 25, 1983

[54] HIGH SPEED TEMPERATURE CONTROLLED ELECTROMETER

[75] Inventors: Wayne J. Whistler, Glendora; Robert S. Loveland, West Covina, both of Calif.

[73] Assignee: The Perkin-Elmer Corporation, Norwalk, Conn.

[21] Appl. No.: 196,997

[22] Filed: Oct. 14, 1980

[51] Int. Cl.³ ............................................ G01N 27/00
[52] U.S. Cl. ................................... 324/457; 324/441; 324/458
[58] Field of Search ................. 330/256; 324/72, 441, 324/458, 457, 465

[56] References Cited

U.S. PATENT DOCUMENTS

| | | | |
|---|---|---|---|
| 3,383,614 | 5/1968 | Emmons et al. | 330/256 |
| 3,392,333 | 7/1968 | Blondfield | 324/441 |
| 3,522,531 | 8/1970 | Cohn | 324/458 |
| 4,222,006 | 9/1980 | Schneider | 324/441 |

Primary Examiner—Michael J. Tokar
Attorney, Agent, or Firm—S. A. Giarratana; E. T. Grimes; T. P. Murphy

[57] ABSTRACT

A high speed temperature controlled, microcircuit electrometer comprising a preamplifier with a very high resistance feedback resistor and temperature sensor on a substrate which is temperature controlled by a thermoelectric module on which the substrate is mounted and which is held within a very small temperature range by temperature control circuitry. The preamplifier, feedback resistor, temperature sensor and thermo-electric module are all enclosed in a hermetically sealed, dry gas environment, maintained at an essentially constant temperature, to reduce the effects of hostile environments, such as temperature changes, vibration, contamination, and humidity. This electrometer operates at high speed and is highly responsive to small current values such as ion currents generated by ionized gas molecules in a mass spectrometer.

19 Claims, 3 Drawing Figures

HIGH SPEED TEMPERATURE CONTROLLED ELECTROMETER

BACKGROUND OF THE INVENTION

This invention relates to electrometers and has for its principal object, the first, reduction of the effects of environmental changes on high impedance electrometers operating in hostile environments such as temperature changes, vibration, contamination, and humidity and, secondly, to increase substantially the speed of response of electrometer.

In the art of mass spectrometry where this invention is useful, it is necessary to accurately detect or measure very small currents, ion currents, in the order of 1 femto ampere, to determine the constituency of a gas. Additionally, it may be necessary to measure these changes rapidly.

To do this, a detector must operate with high speed and be highly sensitive to detect such small current values. Today's measuring devices have been unable to meet this criteria. For example, today's detectors respond to an input current change in 30 to 100 milliseconds (10% to 90% time) whereas with this invention not only is it able to measure low values of current (1 femto amp) but is able to do so in less than 1 millisecond response time. With this invention the capabilities of a mass spectrometer are no longer inhibited since the response time of the electrometer is now typically 100 times faster than the prior art electrometer.

Thus, an object of this invention is to provide a very sensitive high impedance electrometer capable of operating with a mass spectrometer so as to measure extremely low current values and which has a fast response time as to improve the operation of mass spectrometers.

Another object of this invention is to provide a high impedance electrometer having improved performance (speed and sensitivity) due to the minimization of the effects of internal shunt capacitances in and around the high impedance components.

Other and additional objects of this invention will become apparent to those skilled in the art from a study of the drawings and the description thereof and from the more detailed description of the invention hereinafter, as for example, the use of this invention with any device having very small output currents which need an electrometer of this type to measure these currents quickly.

SUMMARY OF THE INVENTION

The high speed temperature controlled electrometer of this invention which meets the foregoing objects and which is an improvement over prior art devices of this type comprises a preamplifier having a very high resistance feedback resistor (a small "chip" type) all mounted on a temperature controlled substrate. The temperature of the substrate is controlled by a thermo-electric module which uses the Peltier effect to cool the substrate on which the substrate is mounted in heat exchange relationship and which is controlled by a temperature control circuit connected to a temperature sensor. The temperature sensor is also mounted on the substrate and, the substrate and thermo-electric module are all enclosed in a hermetically sealed housing. Controlling the temperature of the substrate, and enclosing the temperature sensor, preamplifier and feedback resistor in this housing, where the substrate is controlled to a specific temperature within a tolerance of less than ±0.05° C. over an ambient range of at least 40° C., all of the disadvantages of the prior art due to humidity and sensitivity are eliminated. By being able to connect the electrometer directly to a mass spectrometer, and by using chip type components with short, small diameter (1 mil) interconnecting leads essentially eliminates vibration problems and the reduction of shunt capacitances to increase the speed of response will be apparent from the detailed description of the circuitry.

DETAILED DESCRIPTION OF THE INVENTION

Figure 1:
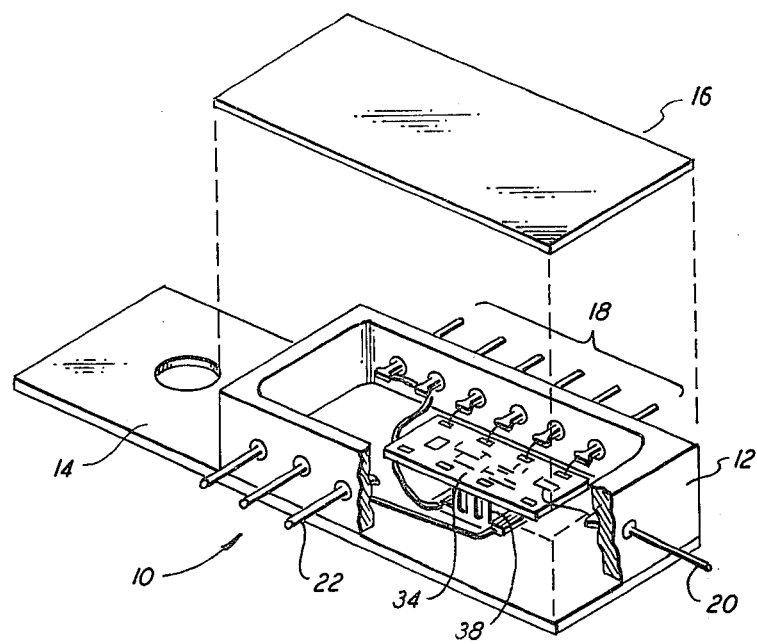
FIG. 1 is perspective partially exploded view of the physical components (hardware) of the invention.
Figure 2:
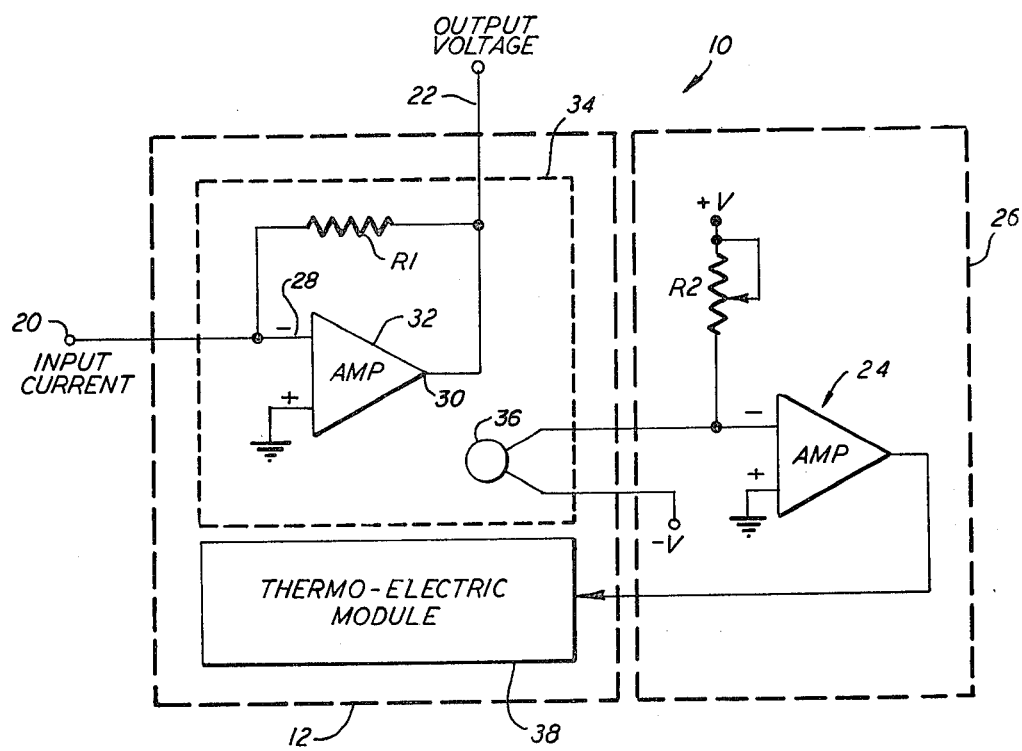
FIG. 2 is a simplified schematic of the components of the invention.

In FIGS. 1 and 2, there is shown a high speed temperature controlled electrometer comprising this invention indicated in its entirety as 10. The electrometer components are enclosed in a housing 12 formed, in part, by a metallic heat sink 14 which extends beyond one wall of the housing (also metallic) to be connected to another heat conductive means (not shown). A lid 16 is hermetically sealed to the housing to form an enclosure in which an inert gas, such as dry nitrogen, is placed. The sealing of the electrometer components within this enclosure in a dry nitrogen environment eliminates the effect of contaminants and humidity on the components.

The electrometer components comprise, respectively, a plurality of input and output pins 18 with one pair 20 and 22 forming the input and output of the electrometer, shown as conductor lines more clearly in FIG. 2, while others form connections to a temperature controller circuit 24 which is also enclosed in a housing shown as a dashed block diagram 26. A high resistance feedback resistor R1 is connected to lines 20 and 22 and in parallel between the input 28 and output 30 of a preamplifier 32. The feedback resistor R1, which can be considered as part of the preamplifier 32, is mounted on a substrate 34 together with a temperature sensor 36 which senses the temperature of the substrate 34 and thus senses the temperature of the feedback resistor R1 and preamplifier 32. Substrate 34 is mounted in heat conducting relationship on a thermo-electric module 38 which controls the temperature of the substrate. The thermo-electric module is mounted in heat conducting relationship on the heat sink tab 14. The heat sink tab may be mounted in a heat conducting relationship to a heat absorbing element (not shown). Potentiometer R2 is used to set the substrate 34 to a desired temperature.

Any variation from the temperature selected for the substrate is sensed by the temperature sensor which sends an error signal to the temperature controller 24 and this deviation from the selected temperature is fed back as a correction signal to the thermo-electric module 38 to return the substrate to the selected temperature. This is very important because the resistance of the feedback resistor R1 and other components in the preamplifier change their characteristics significantly due to changes in temperature. Thus, by controlling module 38, within a minimum temperature range, the temperature problem, which existed in the prior art electrometers, is eliminated. That is to say, this thermo-electric module operating on the Peltier effect cools the substrate and the temperature is controlled to within ±0.05° C. over an ambient change of at least 40°. By holding the temperature of the substrate essentially constant, effects of temperature on the feedback resistor, circuit leakage current and offset voltage are eliminated even though the ambient temperature changes. By connecting the input of the electrometer directly to the output of the mass spectrometer, the problem of vibration has been eliminated since the so called "flying lead" that was used heretofore between the prior art electrometer and the output of the mass spectrometer has been eliminated. Also, by using microcircuit components which utilize interconnects which are extremely short and of small diameter (small mass) vibration sensitivity in the circuit is greatly reduced. Typically, R1 is 0.002 in.$^2$ and the longest interconnect is 0.1 in. of 0.001 thickness.

Figure 3:
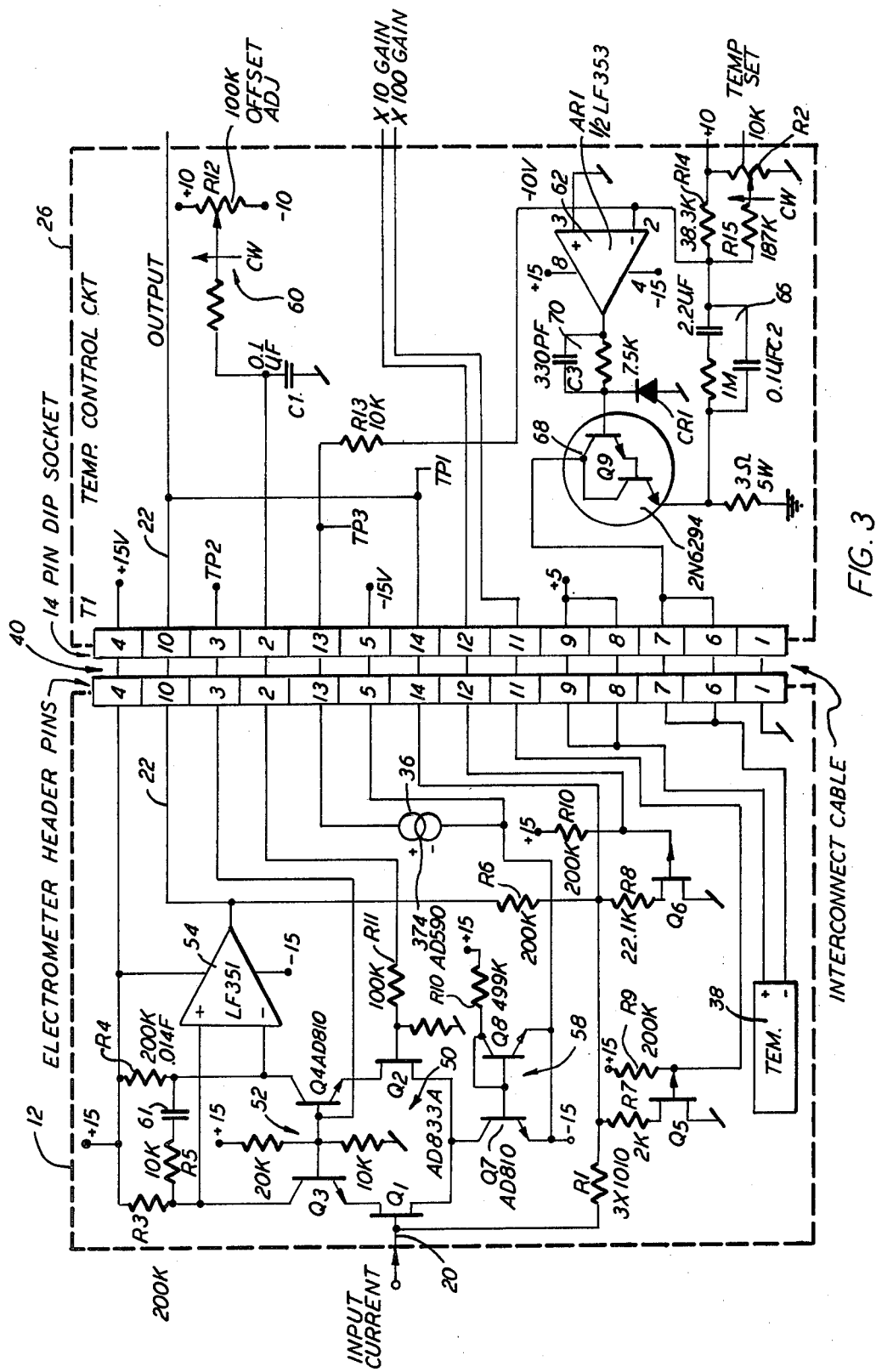
FIG. 3 is a detailed schematic of the components illustrated in FIG. 2.

The manner in which the foregoing temperature control and fast response time due to the greatly minimized shunt capacitances in the circuitry will be apparent from the following description of the circuitry as shown in FIG. 3.

In this Figure, the various components of the circuitry of the electrometer and the temperature controller will be described before the function and operation thereof is described. It should also be noted that in this figure, the previously identified components will bear the same reference numeral as they have in the prior figures.

All of the components enclosed within the dashed block 12 representing the housing, except for the thermo-electric module 38, comprise the preamplifier 32 and all of the components in the second dashed block 26 representing the controller housing comprise the temperature controller 24 and the two are interconnected by any suitable means such as by an interconnect cable 40. By way of explanation, also, in use of a mass spectrometer, there are a number of these electrometers and temperature controllers; only one pair being shown.

The output from the mass spectrometer or any other device, (input 20) is coupled to a first amplifier stage 50 comprising a pair of J-FET transistors Q1 and Q2 shown as a chip AD 833A from Analog Devices, Inc. Input 20 is connected to the gate electrode of transistor Q1 and the source electrode of the transistor is coupled in common with the source electrode of the second transistor Q2. The drain electrodes of each of these two transistors are connected to the emitter electrodes of a pair of bipolar NPN transistors Q3 and Q4 disclosed as chip AD 810 from Analog Devices, Inc. and which comprises a second amplifier 52 and is the load for the first amplifier 50. The base electrodes are respectively connected in common and their collector electrodes are coupled to a positive voltage source through a pair of resistors R3 and R4. Also coupled between resistors R3 and R4 and the collectors of transistors Q3 and Q4 is a third resistor R5 and a capacitor C1 which form a frequency compensation circuit to stabilize the amplifier. The collector of transistor Q3 is also connected to the non inverting node of operational amplifier (op amp) 54 and the collector of transistor Q4 is connected to the inverting node of the op amp 54. The output of the op amp 54 is the output of the electrometer 22. The op amp LF 351 is available from National Semiconductor.

The output line 22 is also connected through resistor R6 to one side of the primary feedback resistor R1, mentioned previously, with the other side of this resistor coupled back to the input gate electrode to the first amplifier 50. The output signal developed across resistor R1, the primary feedback resistor, times the voltage gain of the amplifier, which is described below, produces the output voltage of the spectrometer. The amplifier is, in a sense, an ion current-to-voltage converter.

The importance of the input amplifier 50 and the use of J-FET transistors is that they provide extremely low leakage currents and low noise. The loading amplifier 52 which is connected with amplifier 50 in a cascade configuration eliminates the Miller Effect capacity between the input gate and drain on the transistor Q1 thus reducing the noise in the amplifier by minimizing the effective input capacity of the amplifier 50.

Also connected between resistor R6 and primary feedback resistor R1 is pair of resistors R7 and R8 which respectively connect to the drains J-FET transistors Q5 and Q6 (E 174's from National Semiconductor) whose sources are commonly connected through circuit ground. The gates of these transistors are respectively connected to a positive voltage source (+15 V) through a pair of resistors R9 and R10. This voltage (+15 V) keeps the switches normally open. Connecting the gates to ground turns the switches on. These transistors act as switches to change the effective feedback resistance of the preamplifier. The energization of either of these switches, transistors Q5 or Q6, connects one end of resistors R7 or R8 to ground and since these resistors act as a voltage divider with resistor R6, the ratio of their resistances provide the voltage division which causes the gain to change in the preamplifier. (R7=2K, R8=22K and R6=200K). With both Q5 and Q6 off (open) the effective value of the feedback resistance is R1 itself. By energizing (turning on) Q5 or Q6 the effective value of the feedback resistor can be increased to 10 times R1 or 100 times R1 respectively. It should be noted that values of R6, R7, and R8 may be chosen to accommodate most any desired gain change.

Referring again to the first amplifier 50, it is to be noted that the sources of the transistors Q1 and Q2 are connected in common to the collector of a first of a pair of NPN transistors Q7 and Q8 (a chip AD810 from Analog Devices, Inc.). The emitter of transistor Q7 is connected to a negative voltage source (−15 V) and to the emitter of the second transistor Q8. The bases of these transistors Q7 and Q8 are connected in common to the collector of the second transistor Q8 and through a resistor R10 to a positive voltage source (+15 V).

The function of the transistors Q7 and Q8 is to supply a constant current to the J-FET transistor Q1 and Q2, so that the latter operate at the proper operating level. It is also noted that the gate electrode of transistor Q2 is also connected through a resistor R11 to an offset adjustment device 60 which comprises primarily a variable resistor R12 connected between a positive voltage source (+10 V) and a negative voltage source (−10 V). This permits voltage adjustment to compensate for the offset voltage which exists between transistors Q1 and Q2 and effectively nullifies this difference.

Finally, the negative voltage source (−15 V) is connected to the negative side of the temperature sensor 36; the positive side of which is connected to the temperature control circuitry 24 to be described. Temperature sensor 26 is element AD590 from Analog Device Inc., and is a device whose output current is proportional to the temperature. The output of this device is used in the control loop to control the current thru of the thermo-electric module 38 which in turn controls the substrate temperature.

The positive side of temperature sensor 36 is also connected through a resistor R13 to the inverting or summing node of an operational amplifier 62 (one half LF 353 of National Semiconductor). This negative current is summed together with the positive current from the temperature set device comprising a fixed resistor R14 to +10 V and fixed resistor R15 to the variable resistor R2 connected between the positive voltage source and ground (as is the non-inverting node of Op Amp 62). Also connected to the inverting node of Op Amp 62 is the RC network 66 which in turn is connected to the emitter side of one of the pairs of a Darlington NPN transistor Q9. The base of the other transistor of the Darlington pair Q9 is connected to the output node of the op amp 62 through a second RC network 70 while the collector is connected to the negative side of the thermo-electric module 38. The purpose of the two RC networks 66 and 70 is to optimize loop stability (prevent oscillation) and to optimize the response time of the system. The positive side of the thermo-electric module is connected to a positive voltage source (+5 V). The purpose of the Darlington amplifier is to handle the larger current required by the thermo-electric module 38 (1 amp maximum).

Resistors R2, R14 and R15 are the temperature control resistors for the thermo-electric module control circuit. A positive current therefrom is forced into the summing node, the inverting node of the op amp 62, with the amount of this current being adjusted by adjusting the value of R2. In order for this amplifier 62 to stabilize at the summing node value, the currents must equal zero because the non inverting input node is grounded. This means that the current from the temperature sensor 36, which is an oppositely directed current, must be applied to the summing node and must equal the current from the temperature control resistors. Otherwise op amp 62 will force transistor Q9, to deliver the amount of current necessary to the thermo-electric module 38 to change the temperature and this, in turn, will cause the output of the temperature sensor 36 to change its current output until the negative current from the temperature sensor cancels out the positive current from the temperature set resistors R2, R15 and R16. The initial adjustment of the temperature is set by adjusting resistor R2.

From the foregoing there is disclosed an extremely fast acting sensitive electrometer. The feedback resistor R1 has an effective shunt capacity (total distributed and shunt capacities) of less than 0.01 picofarads and is typically 0.005 picofarads so the response time, which is a function of the effective shunt capacity of the resistance value of R1, is fast.

Too, while the values of the various components (resistors, capacitors, etc.) and voltage levels are shown, they were shown to simplify the description of the invention and those skilled in the art may use different valued components and voltage levels depending upon the specifications of the commercially available items.

Additionally, the ambient temperature operating range may be extended by cascading of the thermoelectric devices which is accomplished by mounting a thermoelectric module atop another thermoelectric module thereby essentially combining the capacities of the thermoelectric modules.

What is claimed is:

1. An electrometer for measuring extremely low currents, in the order of ion current levels, comprising:
   an input and an output,
   preamplifier means connected to said input and adapted to convert the current applied to said input to a voltage corresponding in value to the value of said input current,
   sensor means connected to said preamplifier means for sensing the temperature of said preamplifier during its operation, and
   means connected to said sensor means for controlling the temperature of said preamplifier and sensor means during operation so as to maintain said preamplifier and sensor within a predetermined range of temperature.

2. The electrometer as claimed in claim 1 wherein said preamplifier means and said sensor means are disposed on thermally conducting substrate means,
   thermo-electric means,
   said substrate means being disposed on said thermo-electric means,
   said sensor means and preamplifier means being responsive to the temperature produced by said thermo-electric means, and said control means being coupled to both said sensor means and said thermo-electric means for maintaining the temperature of said substrate in a predetermined temperature level.

3. The electrometer as claimed in claim 2 wherein said preamplifier means comprises a first amplifier, a second amplifier and a third amplifier,
   said first amplifier comprising a pair of JFET transistors,
   said second amplifier being connected to the output of said first amplifier and comprising a pair of bipolar transistors, and
   said third amplifier being coupled to said second amplifier and comprising an operational amplifier.

4. The electrometer as claimed in claim 3 further including an extremely high feedback resistance between the input and the output, said resistance being located on said substrate means and the temperature thereof controlled by said thermo-electric means.

5. The electrometer as claimed in claim 4 wherein means are provided for maintaining the FET gate leakage current to said first amplifier at a predetermined level.

6. The electrometer as claimed in claim 5 wherein means are provided for adjusting the gain of said amplifier means.

7. The electrometer as claimed in claim 6 wherein said means for adjusting the gain comprises a pair of transistors arranged to operate as switches to selectively couple additional resistance means into said circuit and located between said high resistance feedback and said input and output.

8. The electrometer as claimed in claim 7 wherein said temperature control device comprises a control amplifier means and means for adjusting the current flow from and to said amplifier means so as to adjust the temperature of said thermo-electric means.

9. The electrometer as claimed in claim 8 wherein the input to said control amplifier means is connected to said temperature sensor and responsive to the current generated thereby due to changes in temperature and wherein the output of said control amplifier means is connected to said thermo-electric means to control the latter's temperature according to the temperature of the sensor means.

10. The electrometer as claimed in claim 9 wherein said preamplifier means, sensor means, feedback resistance means and thermo-electric means are enclosed in a hermetically sealed housing to protect the enclosed items from humidity and contaminants.

11. The electrometer as claimed in claim 10 wherein said transistors which are arranged to operate as switches are of the FET type.

12. The electrometer as claimed in claim 11 wherein all components with said housing are of the microcircuit type with interconnects, the longest of which is 0.1 in. of 0.001 in. in thickness.

13. The electrometer as claimed in claim 12 wherein said high feedback resistance is in the order of 0.002 in.$^2$ and an effective shunt capacity of less than 0.01 picofarads.

14. An electrometer for measuring extremely low currents, comprising:
   means defining a hollow, hermetically sealed, housing,
   amplifiier means, temperature sensor means, and means for maintaining the temperature of said preamplifier and sensor means at a preselected level, all enclosed within said housing and responsive to control means for maintaining the amplifier and sensor means at the preselected temperature level.

15. The electrometer as claimed in claim 14 wherein said control means is separate from said housing.

16. The electrometer as claimed in claim 15 wherein said control means is coupled to said temperature sensing means and temperature maintaining means for sensing the output signal from said sensor means and producing a signal to be applied to said temperature maintaining means for maintaining the temperature of said temperature maintaining means, amplifier and sensor means at the preselected level.

17. The electrometer as claimed in claim 16 wherein said control means include means for adjusting the gain of said amplifier.

18. The electrometer as claimed in claim 17 wherein said control means includes an operational amplifier, variable resistance means connected to one input to said amplifier and to a voltage source, the output of said sensor means also being connected to said one input so that the signal from said sensor means and the signal from said variable resistance means are summed and compared with a third signal source by said operational amplifier, the output of which is then directed to said temperature maintaining means.

19. An electrometer for measuring extremely low currents in the order of ion current levels, comprising:
   an input and an output,
   a preamplifier means including JFET transistors connected to said input and adapted to convert the current applied to said input to a voltage corresponding in value to the value of said input current,
   sensor means for sensing the temperature of preamplifier during its operation,
   means for controlling the temperature of said preamplifier and sensor means during operation so as to maintain said preamplifier and sensor within a predetermined range of temperature, preferably at operating temperatures less than the environment operating temperature,
   a thermally conducting substrate, said preamplifier means being disposed on said substrate,
   thermo-electric means, said substrate being disposed on said thermo-electric means so that said sensor means and preamplifier are responsive to the temperature of said thermo-electric means, and
   said control means being coupled to both said sensor means and said thermo-electric means for maintaining the temperature of the substrate within a small preselected temperature level,
   an extremely high feedback resistance between said input and said output and located on said substrate, said feedback resistor utilizing resistive materials which enable its size to be extremely small thereby providing extremely small effective shunt capacity promoting its fast response characteristics,
   said control means being coupled to both said sensor means and said thermo-electric means for maintaining the temperature of the substrate to maintain the FET gate leakage small and to hold the resistance value of said feedback resistance within a predetermined range so that input ion current levels may be measured.

* * * * *

UNITED STATES PATENT AND TRADEMARK OFFICE
CERTIFICATE OF CORRECTION

PATENT NO. : 4,370,615
DATED : January 25, 1983
INVENTOR(S) : Wayne J. Whistler and Robert S. Loveland It is certified that error appears in the above-identified patent and that said Letters Patent is hereby corrected as shown below:

Column 4, line 8, "spectrometer" should read
-- electrometer --.

Signed and Sealed this

Eleventh Day of October 1983

[SEAL]

Attest:

GERALD J. MOSSINGHOFF

Attesting Officer    Commissioner of Patents and Trademarks